United States Patent
Huang et al.

(10) Patent No.: US 7,573,080 B1
(45) Date of Patent: Aug. 11, 2009

(54) TRANSIENT SUPPRESSION SEMICONDUCTOR DEVICE

(75) Inventors: Chao-Hsing Huang, Nantou (TW); Yu-Chung Chin, Taoyuan (TW)

(73) Assignee: Visual Photonics Epitaxy Co., Ltd., Taoyuan (TW)

( * ) Notice: Subject to any disclaimer, the term of this patent is extended or adjusted under 35 U.S.C. 154(b) by 0 days.

(21) Appl. No.: 12/143,738

(22) Filed: Jun. 20, 2008

(51) Int. Cl.
*H01L 29/739* (2006.01)
*H01L 23/62* (2006.01)

(52) U.S. Cl. ............... 257/198; 257/197; 257/361; 257/362; 257/E29.033

(58) Field of Classification Search .......... 257/197, 257/198, 361, 362, E29.033
See application file for complete search history.

(56) References Cited

U.S. PATENT DOCUMENTS

| | | | |
|---|---|---|---|
| 6,600,178 B1 * | 7/2003 | Washio et al. | 257/197 |
| RE38,608 E | 10/2004 | Yu et al. | |
| 6,809,400 B2 * | 10/2004 | Harmon et al. | 257/567 |
| 6,974,977 B2 * | 12/2005 | Washio et al. | 257/197 |
| 2001/0048120 A1 * | 12/2001 | Shimawaki | 257/198 |
| 2003/0141518 A1 * | 7/2003 | Yokogawa et al. | 257/194 |
| 2006/0118822 A1 * | 6/2006 | Murata et al. | 257/192 |
| 2006/0220165 A1 * | 10/2006 | Hase | 257/471 |

\* cited by examiner

*Primary Examiner*—Ngan Ngo

(57) ABSTRACT

The HBT-based transient suppression device contains a collector layer of a first conduction type, a base layer of a second conduction type, an emitter layer of the first conduction type, stacked in this order sequentially on a top side of a heavily doped substrate of the first conduction type. The doping concentration of the base layer is higher than that of the emitter and collector layers, and that the thickness of the collector layer is less than 300 nm, so that the $BV_{CEO}$ breakdown voltage is reduced below 5V Additionally, the thickness of the base layer is larger than the sum of the thickness of a section of the emitter-base depletion region extending into the base layer and the thickness of a section of the base-collector depletion region extending into the base layer, so that the base layer is not operated in a punch-through condition.

7 Claims, 2 Drawing Sheets

TRANSIENT SUPPRESSION SEMICONDUCTOR DEVICE

BACKGROUND OF THE INVENTION

1. Field of the Invention

The present invention generally relates to transient suppression in electronic circuitry, and more particularly to a semiconductor device utilizing a heterojunction bipolar transistor structure having a breakdown voltage below 5 volts.

2. The Prior Arts

Protection means against transient voltages such as those arising from electrostatic discharge (ESD) are commonly employed in electronic circuitry. Zener diodes are well-known ESD protection devices, providing active voltage clamping for both positive and negative polarity in a single discrete component. It is based on a mature technology and is available across a full range of Zener breakdown voltages (Vz). However, Zener diodes with Vz less than 5V suffer from relatively high differential resistance and high capacitance per unit device area. As modern high-speed applications impose ever increasing constraints on the maximum allowed parasitic capacitance, the use of such Zener diodes in modern device circuits is therefore significantly restricted.

Punch-through diodes, essentially bipolar transistors, offer an interesting candidate to replace these Zener diodes. These transient suppression devices rely on the punch-through effect between the emitter and the collector. At certain bias between the n+emitter and the n+collector, the p-type base is fully depleted and then the electron potential barrier between the emitter and the base is reduced, causing current from the emitter to the collector to increase significantly. The punch-through effect shifts the clamping voltage to an upper value about 3V U.S. Pat. No. RE38,608 by Yu et al. teaches one punch-through diode capable of suppressing transient voltages below 5V The transient suppression device by Yu et al. has a base including a p+region and a p−region, both sandwiched between an n+emitter and an n+collector. The base has varying doping concentrations so as to improve leakage and capacitance characteristics of the transient suppression device. According to the specification of Yu et al., diffusion doping is used to form the required doping profile of the punch-through diode.

On the other hand, heterojunction bipolar transistors (HBTs), a type of bipolar transistor, are commonly used for high-frequency radio applications. The HBTs form a heterojunction between an emitter region and a base region, thereby making the energy bandgap of the emitter wider than that of the base. The feature of HBTs resides in that, since there is a substantially low injection of carriers from the base to the emitter, it is possible to increase the doping concentration in the base while maintaining the emitter injection efficiency at a high level. Therefore, it is possible to narrow the base width and lower the internal base resistance. As a result, it is possible to improve the resistance of the transient suppression device.

Conventionally, HBTs are operated well below their common-emitter breakdown voltage, and a high common-emitter breakdown voltage is commonly considered a positive performance indicator for HBTs. However, for people skilled in the art, it is well known that HBTs, due to its high base doping concentration and high injection efficiency, is already equipped with the required positive feedback mechanism for breaking down. Therefore, if the breakdown voltage of HBTs could be reduced, HBTs could be a potential candidate for transient protection.

BRIEF SUMMARY OF THE INVENTION

Accordingly, a novel transient suppression device utilizing a HBT structure is provided herein to achieve a clamping voltage below 5V The HBT-based transient suppression device contains a collector layer of a first conduction type (e.g., n type), a base layer of a second conduction type opposite to the first conduction type (e.g., p type), an emitter layer of the first conduction type, stacked in this order sequentially on a top side of a heavily doped substrate of the first conduction type.

According to the present invention, the doping concentration of the base layer is higher than that of the emitter and collector layers, and that the thickness of the collector layer is less than 300 nm, so that the $BV_{CEO}$ breakdown voltage is reduced below 5V Additionally, the thickness of the base layer is larger than the sum of the thickness of a section of the emitter-base depletion region extending into the base layer and the thickness of a section of the base-collector depletion region extending into the base layer, so that the base layer is not operated in a punch-through condition.

One significant advantage for having such an HBT-based transient suppression device is that, due to the base layer's higher doping concentration than that of the emitter and collector layers, and the base layer's not being operated in the punch-through condition, its resistance would be superiorly smaller than those transient suppression devices operated in the punch-through condition.

The foregoing and other objects, features, aspects and advantages of the present invention will become better understood from a careful reading of a detailed description provided herein below with appropriate reference to the accompanying drawings.

DETAILED DESCRIPTION OF THE INVENTION

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
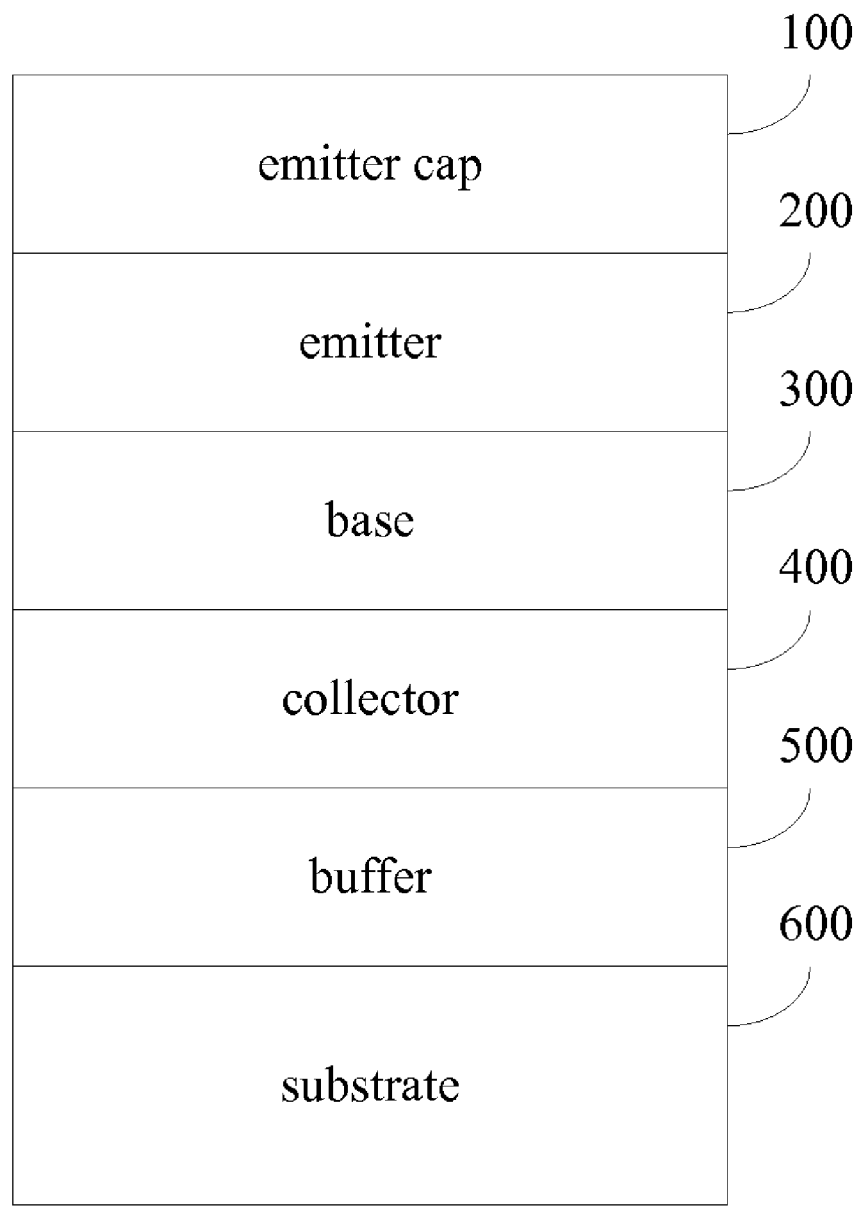
FIG. 1 is a schematic diagram showing a transient suppression device according to the present invention.

FIG. 1 is a schematic diagram showing a transient suppression device according to the present invention. As illustrated, the transient suppression device contains a n-type collector layer 400 made of a first semiconductor material, a p-type base layer 300 made of a second semiconductor material, a n-type emitter layer 200 made of a third semiconductor material, and a heavily doped n-type emitter cap layer 100, stacked in this order sequentially on a top side of a heavily doped n-type substrate 600. Please note that the diagram is for illustration purpose and it not drawn to scale. An optional n-type buffer layer 500 could be sandwiched between the n-type collector layer 400 and the n-type substrate 600.

The third semiconductor material is different from the second semiconductor material (therefore, a heterojunction would be formed between the emitter layer 200 and the base layer 300), and the third semiconductor material has a larger bandgap (Eg) than that of the second semiconductor material. On the other hand, the first semiconductor material could be either different from or the same as the second or third semiconductor material. To those skilled in the related arts, it could be readily recognized that the structure shown in FIG. 1 is similar to a HBT. The structure shown in FIG. 1 therefore could be manufactured using a process similar to those used to build HBTs. The details are omitted here for simplification sake.

For conventional HBTs applied in high frequency applications, the substrate is usually non-conductive or semi-insulating for insulation purpose. For the present invention, a heavily doped n-type substrate 600 is used so that an electrode could be directly formed beneath the substrate 600 and a simpler manufacturing process could be achieved.

Most, if not all, conventional HBTs have an n-p-n structure (i.e., p-type base layer sandwiched between n-type emitter and collector layers) described above, as electrons are much faster carriers than the holes. However, for transient suppression, speed is a somewhat less important factor compared to the high-speed applications where conventional HBTs are commonly used. Therefore, it is feasible to have a transient suppression device using a p-n-p HBT structure, as long as it follows the specifications of the present invention. For simplicity sake, in the following, still an n-p-n structure is assumed. It should be understood that these specifications are readily applicable to transient suppression device of a p-n-p structure as well.

For the structure shown in FIG. 1 to be suitable as a transient suppression device with a clamping voltage less than 5V, it is required the $BV_{CEO}$ breakdown voltage of the structure shown in FIG. 1 has to be below 5V. According to the following equation:

$$BV_{CEO} = \frac{BV_{CBO}}{\sqrt[n]{\beta}},$$

either the current gain ($\beta$) has to be large and/or the base-collector breakdown voltage ($BV_{CBO}$) has to be small. $BV_{CBO}$ is positively related to the thickness of the collector layer, among other factors. According to the present invention, the thickness of the collector layer 400 (hereinafter, Wc) should be less than 300 nm, in contrast to a conventional HBT whose collector layer is usually at least 500 nm in thickness (so that the HBT has a much higher $BV_{CEO}$).

To prevent the punch-through effect, according to the present invention, the p-type doping concentration of the base layer 300 should be larger than the n-type doping concentration of the emitter layer 200 and the collector layer 400 (which is around $1\times10^{15}/cm^3 \sim 1\times10^{20}/cm^3$).

Figure 2:
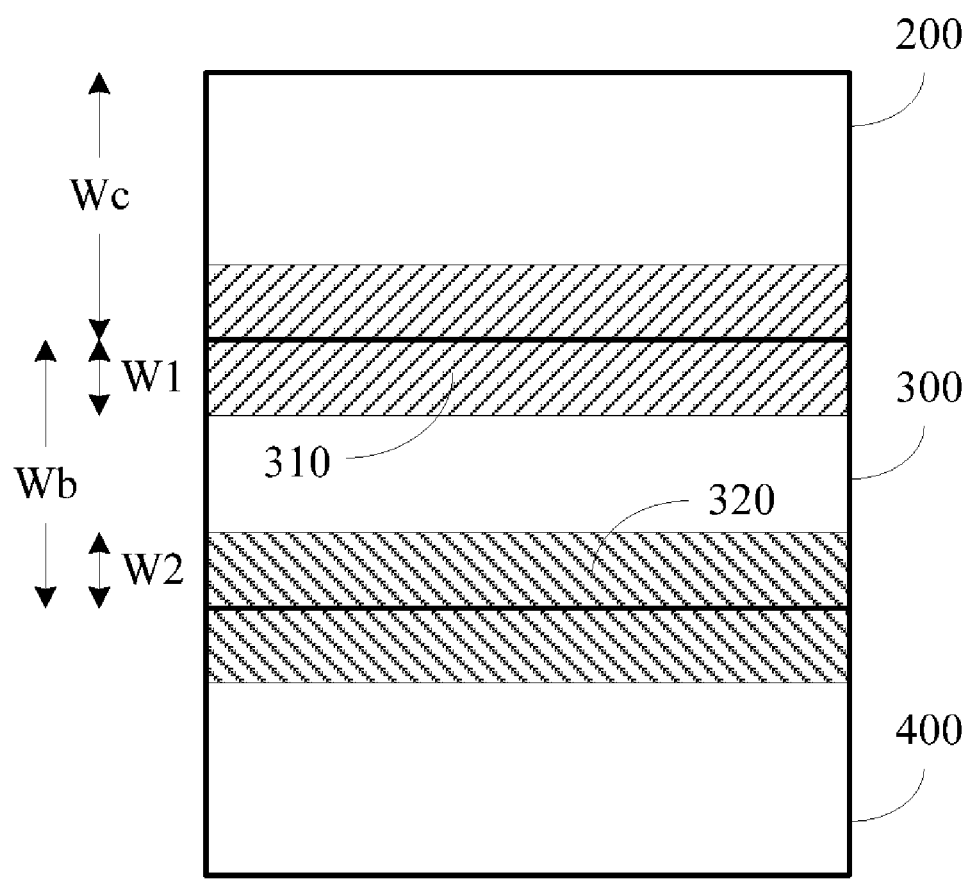
FIG. 2 is an enlarged schematic diagram showing the emitter layer, the base layer, and the collector layer of FIG. 1.

An additional requirement of the present invention, especially in contrast to the punch-through diode approach, is that the base layer 300 shouldn't be punched through. More specifically, the base layer 300 shouldn't be completely depleted by the emitter layer 200 and the collector layer 400 when the transient suppression device is under its operational voltage. FIG. 2 is an enlarged schematic diagram showing the emitter layer 200, the base layer 300, and the collector layer 400 of FIG. 1. As illustrated, the shaded areas 310 and 320 are the depletion regions at the junction between the emitter layer 200 and the base layer 300 (hereinafter, the emitter-base depletion region), and at the junction between the base layer 300 and the collector layer 400 (hereinafter, the base-collector depletion region), respectively.

To prevent the base layer 300 from being punched through, the thickness of the base layer 300 (hereinafter, Wb) should satisfy the equation $$Wb > W1 + W2,$$

where W1 is the thickness of the emitter-base depletion region 310 that extends into the base layer 300, W2 is the thickness of the base-collector depletion region 320 that extends into the base layer 300.

W1 and W2 could be determined by the following equations:

$$W1 = \left[ \frac{2\varepsilon_B(V_{o1} - V_{BE})}{qN_B N_E \left(N_E + \frac{\varepsilon_B}{\varepsilon_E} N_B\right)} \right]^{1/2} N_E, \text{ and}$$

$$W2 = \left[ \frac{2\varepsilon_B(V_{o2} - V_{BC})}{qN_B N_C \left(N_C + \frac{\varepsilon_B}{\varepsilon_C} N_B\right)} \right]^{1/2} N_C,$$

where $q=1.6\times10^{19}$ C is the magnitude of a unit charge, $V_{BE}$ is the voltage across the emitter and base junction under the operational voltage, $V_{BC}$ is the voltage across the base and collector junction under the operational voltage, $N_B$ is the doping concentration of the base layer 300, $N_E$ is the doping concentration of the emitter layer 200 ($N_B > N_E$)

$N_C$ is the doping concentration of the collector layer 400 ($N_B > N_C$), $\varepsilon_B$ is the dielectric constant of the base material (i.e., the second semiconductor material), $\varepsilon_E$ is the dielectric constant of the emitter material (i.e., the third semiconductor material), $\varepsilon_C$ is the dielectric constant of the collector material (i.e., the first semiconductor material), $V_{o1}$ is the contact potential between the emitter and base layers 200 and 300

$$\left(V_{01} = \frac{F_E - F_B}{q},\right.$$

where $F_B$ is the Fermi energy of the base layer 300, $F_E$ is the Fermi energy of the emitter layer 200), $V_{o2}$ is the contact potential between the base and collector layers 300 and 400

$$V_{02} = \frac{F_C - F_B}{q},$$

where $F_C$ is the Fermi energy of the collector layer 400).

Once W1 and W2 are determined by the above equations, Wb could be determined and applied in the manufacturing process to make sure that the base layer 300 is not completely depleted.

the HBT-based transient suppression device described above, due to the base layer 300's higher doping concentration than that of the emitter and collector layers 200 and 400, and the base layer 300's not being operated in the punch-through condition, the base resistance would be superiorly smaller than those transient suppression devices operated in the punch-through condition.

It is mentioned earlier that the present invention's structure could be manufactured using a conventional HBT process. However, it should be noted that, as the present invention requires precise control over doping uniformity, doping concentrations, and the thickness of the various layers, so as to achieve a precise breakdown voltage. Conventional epitaxial growth methods such as Molecular Beam Epitaxy (MBE), Metal Organic Chemical Vapor Deposition (MOCVD), etc. should be adopted, instead of the diffusion doping method used by Yu et al.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A transient suppression semiconductor device, comprising a collector layer made of a first semiconductor material of a first conduction type, a base layer made of a second semiconductor material of a second conduction type opposite to said first conduction type, an emitter layer made of a third semiconductor material of said first conduction type, stacked in this order sequentially on a top side of a substrate; wherein
    an emitter-base depletion region expands across said emitter and base layers;
    a base-collector depletion region expands across said base and collector layers;
    said third semiconductor material is different from said second semiconductor material;
    said third semiconductor material has a bandgap larger than that of said second semiconductor material;
    said base layer has a doping concentration higher than that of said emitter and collector layers;
    said collector layer has a thickness less than 300 nm; and
    said base layer has a thickness larger than the sum of the thickness of a section of said emitter-base depletion region that extends into said base layer and the thickness of a section of said base-collector depletion region that extends into said base layer.

2. The transient suppression device according to claim 1, wherein said substrate is heavily doped.

3. The transient suppression device according to claim 1, further comprising an buffer layer of said first conduction type sandwiched between said collector layer and said substrate.

4. The transient suppression device according to claim 1, wherein said first semiconductor material is identical to at least one of said second and third semiconductor material.

5. The transient suppression device according to claim 1, wherein said emitter layer and said collector have a doping concentration between $1 \times 10^{15}/cm^3 \sim 1 \times 10^{20}/cm^3$.

6. The transient suppression device according to claim 1, wherein said first conduction type is n type.

7. The transient suppression device according to claim 1, wherein said first conduction type is p type.

* * * * *